United States Patent
Lo

(10) Patent No.: US 6,184,144 B1
(45) Date of Patent: Feb. 6, 2001

(54) METHODS FOR GROWING DEFECT-FREE HETEROEPITAXIAL LAYERS

(75) Inventor: Yu-Hwa Lo, Ithaca, NY (US)

(73) Assignee: Cornell Research Foundation, Inc., Ithaca, NY (US)

( * ) Notice: Under 35 U.S.C. 154(b), the term of this patent shall be extended for 0 days.

(21) Appl. No.: 09/166,962

(22) Filed: Oct. 6, 1998

Related U.S. Application Data

(60) Provisional application No. 60/061,565, filed on Oct. 10, 1997.

(51) Int. Cl.⁷ .................. H01L 21/311; C30B 33/06; C30B 29/42

(52) U.S. Cl. .................. 438/703; 117/1; 117/954

(58) Field of Search .................. 117/1, 902, 106, 117/954; 257/183, 190, 200, 12; 438/694, 703

(56) References Cited

U.S. PATENT DOCUMENTS

| | | |
|---|---|---|
| 4,279,688 | 7/1981 | Abrahams et al. . |
| 4,482,422 * | 11/1984 | McGinn et al. ............ 156/610 |
| 4,549,926 | 10/1985 | Corboy, Jr. et al. . |
| 4,612,072 | 9/1986 | Morrison et al. . |
| 4,657,603 | 4/1987 | Kruehler et al. . |
| 4,826,784 * | 5/1989 | Salerno et al. ............ 437/89 |
| 4,840,921 * | 6/1989 | Matsumoto et al. ............ 437/89 |
| 4,925,810 * | 5/1990 | Kano et al. ............ 437/105 |
| 4,994,867 | 2/1991 | Biegelsen . |
| 5,087,296 | 2/1992 | Kondo et al. . |
| 5,091,333 | 2/1992 | Fan et al. . |
| 5,091,767 | 2/1992 | Bean et al. . |
| 5,122,223 * | 6/1992 | Geis et al. ............ 156/603 |
| 5,134,091 | 7/1992 | Chikyou et al. . |
| 5,156,995 | 10/1992 | Fitzgerald, Jr. et al. . |
| 5,210,052 * | 5/1993 | Takasaki ............ 437/132 |
| 5,221,367 * | 6/1993 | Chisholm et al. ............ 148/33 |
| 5,238,869 * | 8/1993 | Shichijo et al. ............ 437/126 |
| 5,259,918 | 11/1993 | Akbar et al. . |
| 5,272,106 * | 12/1993 | Yacobi et al. ............ 437/89 |
| 5,278,092 | 1/1994 | Sato . |

(List continued on next page.)

OTHER PUBLICATIONS

S. Guha, et al., "Onset of Incoherency and Defect Introduction in the Initial Stages of Molecular Beam Epitaxial Growth of Highly Strained InxGa1–xAs on GaAs(100)," Applied Physics Letters, vol. 57 (No. 20), pp. 2110–2112, (Nov. 12, 1990).

(List continued on next page.)

Primary Examiner—Benjamin L. Utech
Assistant Examiner—Matthew Anderson
(74) Attorney, Agent, or Firm—Jones, Tullar & Cooper PC

(57) ABSTRACT

New methods for growing threading dislocation free heteroepitaxy are proposed and investigated theoretically. The first method contains four key steps: Stranski-Krastanov island formation, strain relaxation by defect nucleation, in-situ defect removal, and island coalescence. The central idea is that the defects are utilized to relax the lattice strain, and as soon as the strain is relaxed, the dislocation segments are removed that will propagate to the surface of the film. As a result, the heteroepitaxial film is expected to be relaxed but be free of harmful threading dislocations regardless of the degree of lattice mismatch. In the second method, single crystal islands or patches are grown initially which are a few hundred nanometers or less in diameter. The patches serve as nucleation sites for growth of single crystal heteroepitaxial layers. Because of the very small patch size, the stress (normal stress and shear stress) due to lattice mismatch will be reduced significantly. As the growth proceeds, the size of nucleation islands increases in both vertical and lateral directions and the discrete islands soon coalesce to form a continuous thin film. If all coalescing islands have the same or nearly the same crystal orientation, then the net stress will be close to zero, and a smooth, defect-free heteroepitaxial layer can be grown to any thickness.

13 Claims, 3 Drawing Sheets

U.S. PATENT DOCUMENTS

| | | |
|---|---|---|
| 5,281,283 | 1/1994 | Tokunaga et al. . |
| 5,296,087 | 3/1994 | Tokunaga . |
| 5,356,509 * | 10/1994 | Terranova et al. .................. 437/126 |
| 5,363,798 | 11/1994 | Yoder . |
| 5,363,799 | 11/1994 | Yonehara et al. . |
| 5,403,771 | 4/1995 | Nishida et al. . |
| 5,423,268 | 6/1995 | Yonehara . |
| 5,438,951 | 8/1995 | Tachikawa et al. . |
| 5,471,944 | 12/1995 | Sato . |
| 5,578,521 | 11/1996 | Suzuki et al. . |
| 5,659,187 | 8/1997 | Legoues et al. . |
| 5,690,736 | 11/1997 | Tokunaga . |
| 5,733,369 | 3/1998 | Yonehara et al. . |

OTHER PUBLICATIONS

D.J. Eaglesham et al., "Dislocation–Free Stranski–Kratanow Growth of Ge on Si(100)," Physical Review Letters, vol. 64 (No. 16), pp. 1943–1946, (Apr. 16, 1990).

F.K. Legoues et al., "Microstructure and Strain Relief of Ge Films Grown Layer by Layer on Si(001)," Physical Review B, vol. 42 (No. 18), pp. 690–700, (Dec. 15, 1990).

S. Ruvimov et al., "Structural Characterization of (In,Ga)As Quantum Dots in a GaAs Matrix," Physical Review B, vol. 51 (No. 20), pp. 766–769, (May 15, 1995).

* cited by examiner

METHODS FOR GROWING DEFECT-FREE HETEROEPITAXIAL LAYERS

This application claims the benefit of U.S. Provisional Application Ser. No. 60/061,565, filed Oct. 10, 1997.

BACKGROUND OF THE INVENTION

The present invention relates to methods for growing high-quality, defect-free heteroepitaxial layers on any crystal substrates, regardless of the degree of lattice mismatch between the layers and the substrates.

A long-sought dream for semiconductor material research is to find methods for growing high-quality epitaxial layers on essentially any substrates regardless of the degree of lattice mismatch. However, the analysis of strain energy in a pseudomorphic material system suggests that this dream is unlikely to come true because threading dislocations will form when the epilayer thickness is well above the critical thickness. The concept of critical thickness has been so widely accepted by the semiconductor community that it has been used as a guiding principle for design of compound semiconductor material systems.

Recently, the emergence of compliant substrates raised hopes of lifting the constraint of critical thickness. By making the substrate compliant to an epitaxial layer grown on top, it is theoretically possible to grow threading dislocation free heteroepitaxy. One promising compliant substrate technology developed by the inventor involves bonding an ultra-thin semiconductor layer to a bulk crystal with an angle between their crystal axes, thereby forming a so-called twist-bonded compliant substrate. Experimental results have shown that threading dislocation free InGaP, InGaAs and InSb layers can be grown on such twist-bonded GaAs compliant substrates with a lattice mismatch as large as 15% in some cases. Other compliant substrates may have an SOI structure or use other thin film and bulk crystal bonding techniques.

In spite of the encouraging initial results obtained from compliant substrates, putting very thin (say 100 Å) single crystal semiconductor layers on a bulk crystal is a very challenging and sometimes costly task. For low cost devices such as color LEDs, solar cells and solid state sensors, substrate cost becomes a significant part of the device cost. In such situations, the compliant substrate approach will have to face a trade-off between the device cost and performance. Thus, the most ideal scenario would be if high-quality heteroepitaxial layers could be formed on any commercial semiconductor substrates, such as Si and GaAs substrates, without having to perform any pre-growth processing or treatment of the substrates.

SUMMARY OF THE INVENTION

The present invention addresses the foregoing concerns by providing two new methods for growing defect-free heteroepitaxial layers on any type of substrates, including conventional semiconductor substrates, which do not require special pre-growth treatment of the substrates. In the new methods, instead of making special treatments of the substrate surface as is done for compliant substrates, the nature of the material growth is employed to achieve defect-free heteroepitaxy. More particularly, specific growth steps are employed which inherently eliminate either the defects or the stresses which cause the defects.

Both of the methods rely on the formation of small three-dimensional islands on the substrate, which are subsequently exposed to treatment steps that cause the islands to coalesce, and form a smooth, defect-free surface. In a first of the methods, the following specific steps are carried out: initializing three-dimensional island growth, facilitating strain relaxation by thermal annealing, removing harmful defects using in-situ etching which leaves the benign defects at the heteroepitaxial interface intact, creating island coalescence, and starting two-dimensional growth to achieve a smooth surface. When islands are nucleated on the substrate surface, the islands may contain no defects even with a large lattice mismatch until they reach a certain size. When the islands become larger, the second step, thermal annealing, will result in defect generation within each island so that its internal strain can be relaxed. The interfacial misfit dislocations are considered the "benign defects" since they always stay at the interface; but the segments of defects near the edges of the island tend to propagate towards the surface as harmful threading dislocations. Unfortunately, these "harmful" defects always coexist with the "benign" defects since together they form a stable dislocation half loop. The third step is to remove only the "harmful" dislocation sections by in-situ etching. This is possible since all "harmful" dislocations are located very near the edges of the islands so etching of only a few monolayers of the heteroepitaxial material can remove those defects completely.

After repeating the above steps a few times, the islands grow bigger after each cycle while remaining strain relaxed and free of "harmful" dislocations. Finally, these islands will coalesce. The coalescence of islands creates additional strain to the heteroepitaxial layer since the spacing between two islands is not necessarily multiples of the equilibrium lattice spacing of the heteroepitaxial material. However, it can be shown, that the additional strain is first of all, too small to create new "harmful" defects and secondly, will not be accumulated to form long range strain when all islands coalesce to form a continuous layer. It can be proved that the net strain due to coalescence of all the islands should vanish due to the cancellation of strain of different polarities. Once a continuous and lattice-relaxed heteroepitaxial layer is formed, the surface will be smoothed by further growth to reduce the surface energy of the material. This will finally lead to a high-quality heteroepitaxial layer with a featureless surface morphology, most ideal for device applications.

In the second method, the islands, otherwise referred to as patches, are each no bigger than a few hundred nanometers in diameter, and are formed from a single crystal. The patches serve as nucleation sites for growth of single crystal heteroepitaxial layers. Because of the very small patch size, the stress (normal stress and shear stress) due to lattice mismatch will be reduced significantly. As the growth proceeds, the size of nucleation islands increases in both vertical and lateral directions and the discrete islands soon coalesce to form a continuous thin film. It is critical that no dislocations are generated at the conjunction of islands. If all coalescing islands have the same or nearly the same crystal orientation, then the net stress will be close to zero. This means that the smooth, defect-free heteroepitaxial layer can be grown to any thickness without a critical thickness limit.

BRIEF DESCRIPTION OF THE DRAWINGS

The features and advantages of the present invention will become apparent from the following detailed description of a number of preferred embodiments thereof, taken in conjunction with the accompanying drawings, in which.

DETAILED DESCRIPTION OF THE PREFERRED EMBODIMENTS

The method steps carried out in a first embodiment of the present invention are illustrated in FIGS. 1A–F. When the lattice mismatch between a substrate 10 and a heteroepitaxial layer 12 (epilayer) grown thereon is greater than, for example, 3%, island growth instead of 2D growth will take place after deposition of first few monolayers. This is because when the strain energy becomes dominant over the surface energy due to large lattice mismatch, island growth is strongly favored in terms of minimizing the total energy of the system.

Figure 1A:
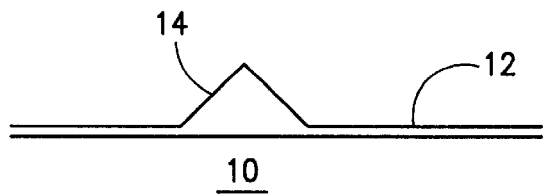
FIGS. 1A, 1B, 1C, 1D, 1E, 1F are schematic illustrations of the method steps for growing a defect-free heteroepitaxial layer in accordance with a first embodiment of the present invention.

FIG. 1A shows a typical un-relaxed Stranski-Krastanov (SK) island 14 where the pyranidal island is defined by a set of high index planes for diamond and zinc-blende crystals. It will be understood that a plurality of the islands 14 will be formed on the substrate 10, although only one of them is shown in FIG. 1A for convenience. The formation of SK islands has been studied extensively since they have been used as self-assembled quantum dots for their interesting optical properties. In some situations, Volmer-Weber (VW) islands instead of SK islands may be formed. The subject method applies to both types of islands and SK islands will be used here as an example. The difference between SK islands and VW islands is in the interface energy between the heteroepitaxial material and the substrate. Since such a distinction does not affect how the new method works, no distinction is made between these two types of islands in the following discussion.

Figure 1B:
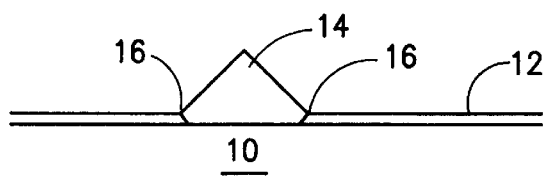

As the growth continues, each SK island 14 will grow bigger and its strain energy will eventually increase beyond the critical value to favor the formation of dislocations. The most energetically favorable way to nucleate misfit dislocations is shown in FIG. 1B. Dislocations 16 will be nucleated near the edge of the island 14 rather than anywhere else for three reasons: the lowest dislocation nucleation energy, the longest misfit dislocation length for effective strain release, and the highest shear stress are all at the edge of the island 14. The first two points can be understood graphically, and a more detailed analysis on the shear stress will be presented later.

Figure 1C:
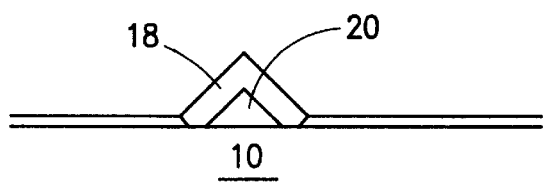
Figure 1D:
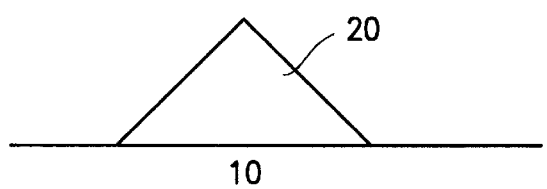

After the formation of the misfit dislocations 16, the strain in each island 14 is (partially) relaxed. In-situ etching of the epilayer 12 will be used to remove the threading dislocation segments near the very bottom of each island, as illustrated in FIG. 1C. Normally, only a few monolayers 18 need to be removed and the in-situ etching can be performed in both MBE and OMCVD chambers. Possible ways to remove only a few monolayers of the defected crystal include thermal etching, gas etching, and surface oxidation and oxide desorption. After in-situ etching, the surface of the substrate will have a randomly distributed array of (partially) relaxed islands 20.

The process of FIGS. 1A–1C may be repeated several times. After each cycle, the islands 20 will grow in size but remain relaxed and free of threading dislocations (FIG. ID). This is so because after each cycle, the body of the island 20 is relaxed so it can grow to a bigger size in the next cycle until new dislocations form to relax the extra stress introduced by the deposition of the additional layer. When these relaxed islands coalesce, additional strain components 22 are introduced because the spacing between two islands does not necessarily match the equilibrium lattice constant of the heteroepitaxial layer. Assuming the average size of each island 20 is "L" and the lattice constant of the heteroepilayer 12 is "a", the strain, E, introduced by coalescence of two of the islands 20 is a random variable with a constant probability density in the range from $-a/4L$ to $a/4L$. The minus sign represents tension and the plus sign represents compression. Since L is typically on the order of 100 Å, so the maximum possible strain added to the coalesced islands is about 0.25%, which is far less than the strain needed to create new dislocations.

Figure 1E:
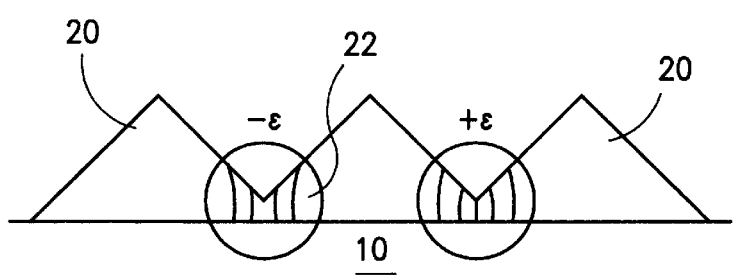
Figure 1F:
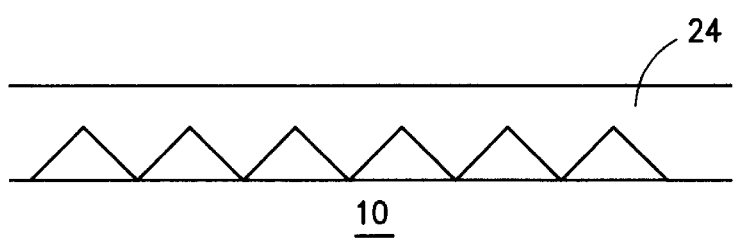

When more of the islands 20 overlap and finally cover the entire substrate 10 as illustrated in FIG. 1E, the net strain in the heteroepitaxial layer will be just canceled (FIG. 1(e)). As the growth continues, the rough surface will be smoothed and 2D growth will start to minimize the surface energy as illustrated in FIG. 1F. Finally, a threading dislocation free heteroepitaxial layer 24 with a large lattice mismatch to the substrate will form on the conventional bulk substrate 10.

The following is a discussion of (1) shear stress distribution in an island, and (2) conditions for island formation. A more quantitative analysis on these two problems help explain the proposed heteroepitaxial growth model. The key results will be given without detailed derivations.

To simplify the mathematics, a pyramidal SK island is approximated into a rectangular island with an effective island height, $h_{eff}$. With the further assumption that the two dimensional shear stress analysis can be decoupled into two one-dimensional problems and the substrate is much thicker than the island, the shear stress distribution, $\tau(x)$, along the base of the island can be represented approximately as:

$$\tau(x) \approx \epsilon C \, (h_{eff}/h_s)^{1/2} \text{Sin } h \, (kx)/\text{Cos } h \, (kL/2) \quad -L/2 < x < L/2 \quad (1)$$

where $\epsilon$ is the strain due to lattice mismatch, $h_{eff}$ and $h_s$ are effective height of the island and the thickness of the substrate, L is the width of the island, C is a composite elastic constant, and k is the inverse characteristic length. More specifically, C and k are defined by:

$$C = [3E_1 E_2]^{1/2}[2(1-v_1^2)(1+v_2)]^{-1/2} \quad (2)$$

$$k[3(1-v_1^2)E_2/2(1+v_2)E_1]^{1/2}(h_{eff} h_s)^{-1/2} \approx (h_{eff} h_s)^{-1/2} \quad (3)$$

where $E_{1,2}$ and $v_{1,2}$ are the Young's moduli and Poisson ratios of the island material and the substrate, assuming both materials are isotropic.

For a typical SK island with $h_{eff} \approx 100$ Å, $h_s \approx 100$ μm, and $L \approx 100$ Å, the product of $kL/2$ is much less than 1, so Eq. (1) can be written as $$\tau(x) \approx [3 \, E_2/2 \, (1+v_2)]\epsilon \, x/h_s, -L/2 < x < L/2 \quad (4)$$

This shows that the shear stress is strongest at the edge of the island ($x = \pm L/2$); and the maximum shear stress is linearly proportional to the misfit strain and the size of the island. These results support the assumption that dislocations tend to nucleate at the edge of the island.

Since the proposed method depends critically on the formation of islands in the early stage of growth, it is useful to describe the island formation process in a more quantitative way. Summing the strain energy and surface energy stored in a fixed amount of heteroepitaxial material, it is found that there exists a "critical thickness" above which the growth surface will become corrugated and eventually turns into separated islands. This "critical thickness" should not be confused with the commonly used Matthews-Blakeslee critical thickness for misfit dislocation generation. The critical thickness, $h_c$, in Eq. (5) can be considered approximately as the turning point from 2D growth to 3D island growth.

$$h_c = \sigma(1+v_1)(1-v_1^2)/(2 E_1 \epsilon^2) \quad (5)$$

where $\sigma$ is the surface energy density, and the rest of the parameters have been defined earlier. The inverse square dependence of $h_c$ on the mismatch strain $\epsilon$ indicates that highly mismatched material systems are more inclined to island growth, in agreement with the experimental observations. Also noteworthy is the linear dependence of $h_c$ on the surface energy density. When the surface energy density of the heteroepitaxial material is high, it is less favorable to island growth than to 2D growth because the former has a larger surface area. Therefore, 3D growth will occur at a greater layer thickness ($h_c$). As a final comment, the $h_c$ in Eq.(5) becomes less accurate if its value approaches the atomic lattice constant; and it can not predict whether SK islands or VW islands will form.

Figure 2:
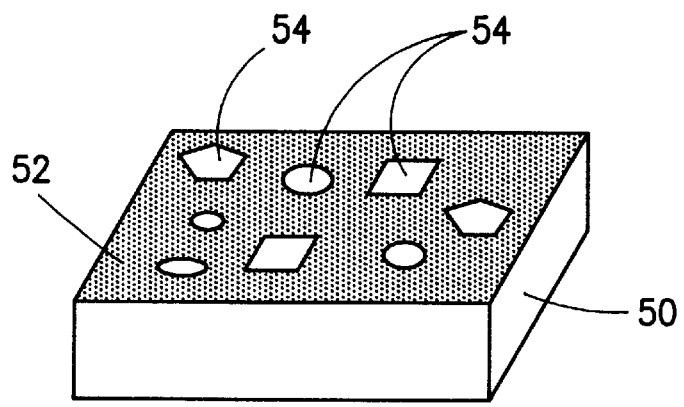
FIG. 2 is a schematic illustration of a substrate that can support defect-free heteroepitaxial growth in accordance with a second embodiment of the present invention.

Turning now to a second preferred embodiment of the present invention, FIG. 2 shows the generic structure of a substrate 50 that will support defect-free heteroepitaxial growth in accordance with the method. A top surface 52 of the substrate should contain many disjoined islands or patches 54 which will serve as nucleation sites for heteroepitaxial growth. These patches 54 can be randomly distributed over the surface and their shape and size uniformity are of no significance to the final results. However, there are two requirements for these nucleation sites. First, they have to be no bigger than a few hundred nanometers in diameter, and preferably are as small as tens of nanometers. Second, these patches 54 should be single crystal although their lattice constant or crystal structure may be different from that of the heteroepitaxial material. For the best result in the sense that the substrate 50 is able to accommodate the largest lattice mismatch, the patches or the nucleation sites 54 should cover less than 50% of the surface area.

Figure 3A:
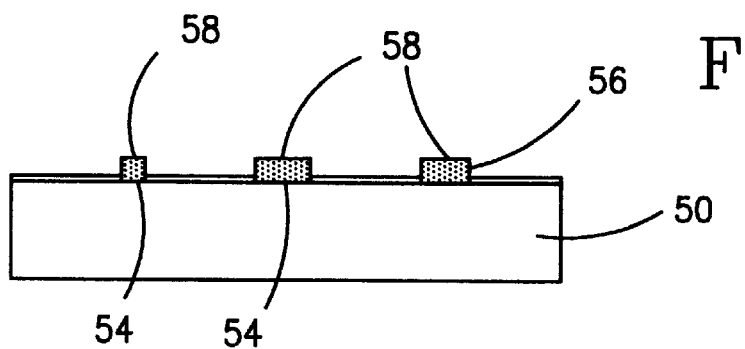
FIGS. 3A, 3B, 3C are schematic illustrations of the process steps carried out in the method of the second embodiment.
Figure 3B:
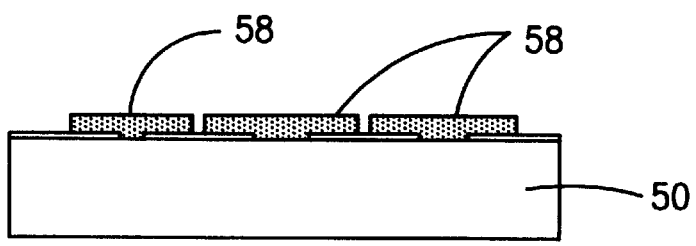
Figure 3C:
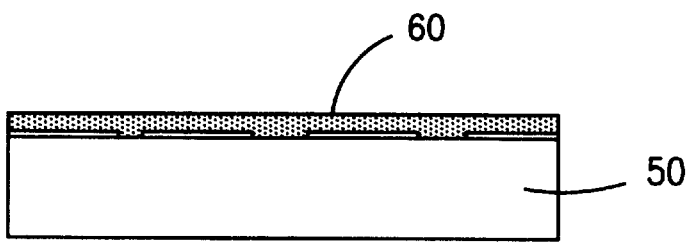

The high-quality heteroepitaxial layer will be formed in the following way, as illustrated in FIGS. 3A–3C. Single crystal heteroepitaxial layers 56 are initially formed as nucleation islands 58 only in the regions of patches 54. Because of the very small patch size, the stress (normal stress and shear stress) due to lattice mismatch will be reduced significantly. In fact only the atoms of the heteroepitaxial layers 56 very close to the surface of the patches will experience significant stress, and other atoms are unstrained so have their equilibrium lattice constant. As the growth proceeds, the size of nucleation islands 58 increases in both vertical and lateral directions and the discrete islands 58 will soon coalesce to form a continuous thin film 60 as illustrated in FIG. 3C. It is critical that no dislocations are generated at the conjunction of islands. If all coalescing islands have the same or nearly the same (say within 2 degrees) crystal orientation, then the strain introduced by island coalescence is caused by the fact that the spacing between islands may not be equal to multiples of the equilibrium lattice spacing of the heteroepitaxial material. The worst mismatch is $+a/2$ or $-a/2$ where a is the lattice constant of the heteroepitaxial material. This space mismatch is much too small to create dislocations when this strain is distributed over the coalesced island of a size greater than 100 times of a. The strain generated this way can be modeled as a random variable having an equal probability of being a positive (compression) or a negative (tension) value. Hence when many islands coalesce to finally form a continuous thin film heteroepitaxial layer, the net stress will be close to zero. This means that the heteroepitaxial layer can be grown to any thickness without a critical thickness limit.

On the other hand, there will be some localized strain in the nucleation regions very near the growth interface. This is because the mismatch strain in those regions is not relaxed by any dislocations. This strain will decay rapidly in space so it will not do any harm to the material unless the spacing between the nucleation sites are too close. The heteroepitaxial layers in either oversized nucleation sites or strongly coupled clusters of nucleation sites will contain a large number of defects. The quantitative relations of the size and spacing of individual nucleation sites with the maximum lattice mismatch the substrate can take can be found by 2D computer simulations. Fortunately, the simple elastic theory will give good approximate answers to this problem, and there exist many computer software programs for such calculations. The rule of thumb is that the size of each nucleation site should not be greater than a few hundred nanometers and their spacing should be at least comparable to their sizes.

The technology of forming small size patches for crystal nucleation over a large substrate is non-trivial. Electron-beam lithography can achieve the feature size, but the high cost and low throughput for E-beam lithography makes it undesirable for real applications. Following are some preferred embodiments.

Figure 4A:
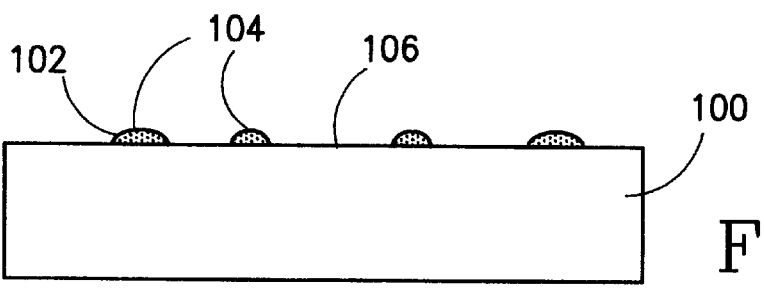
FIGS. 4A, 4B, 4C are schematic illustrations of the process steps carried out in a first variation of the method of the second embodiment as it is specifically applied to a silicon substrate.
Figure 4B:
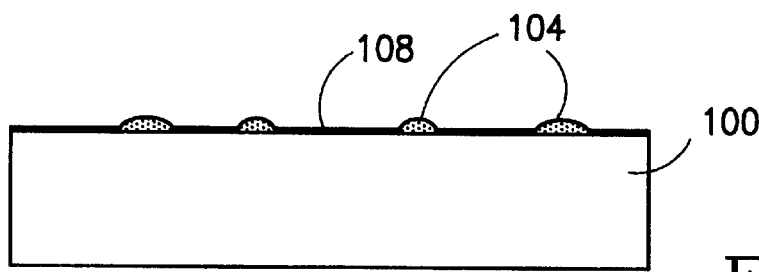
Figure 4C:
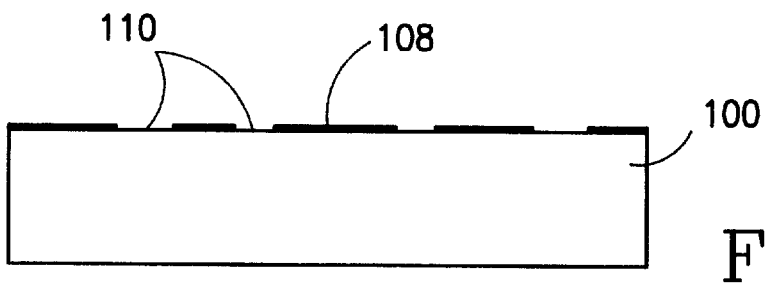

One technique for making Si samples is illustrated in FIGS. 4A–4C. A Si wafer or substrate 100 is first hydrogen passivated (e.g. treated with HF) to avoid surface oxidation and then loaded in an evaporation chamber to evaporate a thin (e.g. 5 nm) layer 102 of metal (e.g. Al) at an elevated substrate temperature (e.g. 250° C.). Instead of forming a continuous Al thin film, small clusters 104 of metal will form on the H-passivated Si surface 106. The Si sample is then treated with low energy oxygen plasma to form a thin layer 108 of $SiO_2$ on the surface 106 except in those areas covered by the Al clusters 104. HCl gas is introduced to the OMCVD reactor before the heteroepitaxial growth starts to etch away the Al clusters 104 and expose the fresh Si surfaces 110 underneath, without attacking the $SiO_2$ layer 108. This forms the surface shown in FIG. 2 for heteroepitaxial growth.

Figure 5A:
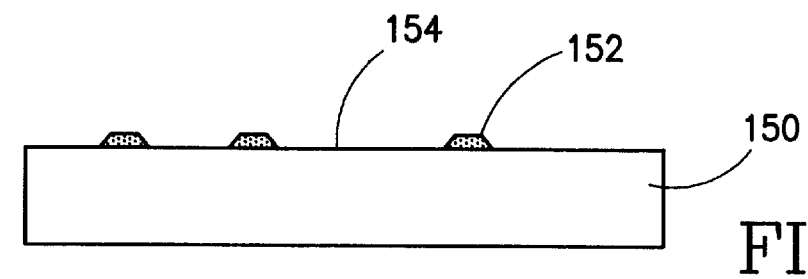
FIGS. 5A–5B are schematic illustrations of the process steps carried out in a second variation of the method of the second embodiment as it is specifically applied to a silicon substrate.
Figure 5B:
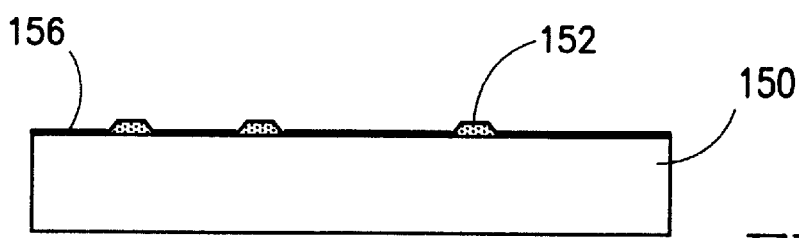

In another technique illustrated in FIGS. 5A–5B, one can grow a very thin layer (e.g. 5 to 15Å) of GaAs on a Si wafer or substrate 150 first, and because of the lattice mismatch between GaAs and Si, small (around 20 nm wide) GaAs islands 152 are formed randomly over the Si surface 154. Then the growth is interrupted and the surface 154 is intentionally oxidized (e.g. exposed to air) to form a $SiO_2$ layer 156 thereon. The sample is heated in the OMCVD reactor again to a temperature (e.g. 700° C.) where the GaAs native oxide can be desorbed but the $SiO_2$ can not. When the growth of GaAs resumes, the GaAs islands will extend laterally over the $SiO_2$ covered regions until the islands coalesce under proper growth conditions.

2D holographic gratings may also be used to create such structures. Using an HeCd laser as the light source, gratings of a period of 200 nm can be formed in both axes of the substrate plane. Using the standard lithographic and etching process for pattern development and transfer, one can create an array of patches of sizes of 50 nm or less separated by about 200 nm The holographic technique offers a way to create an ordered, periodic array of nucleation sites as opposed to randomly distributed nucleation sites.

Although the invention has been disclosed in terms of a number of preferred embodiments and variations thereon, it should be understood that numerous additional variations and modifications could be made thereto without departing from the scope of the invention as defined in the following claims.

What is claimed is:

1. A method for growing a defect-free heteroepitaxial layer on a substrate comprising the steps of:
   a) providing a substrate formed from a first material;
   b) growing a heteroepitaxial layer formed from a second material on said substrate until a plurality of islands are formed on said substrate, said second material being selected to be lattice mismatched with said first material;
   c) continuing the growth of said heteroepitaxial layer until misfit dislocations are formed near one or more edges of said islands, thereby relaxing strain in said islands;
   d) etching said heteroepitaxial layer to remove a portion thereof containing said dislocations, thereby leaving said relaxed islands on said substrate; and
   e) repeating steps c) and d) as necessary until the relaxed islands overlap with one another, and said heteroepitaxial layer becomes smooth and dislocation-free.

2. The method of claim 1, wherein said second material has a lattice mismatch with said first material that is greater than approximately 3%.

3. The method of claim 2, wherein said step of growing said heteroepitaxial layer on said substrate further comprises growing said layer to a thickness of at least $h_c$ to form said islands, where $h_c = \sigma(1+v_1)(1-v_1^2)/(2 E_1 \epsilon^2)$, $\sigma$ is the surface energy density, $E_1$ and $v_1$ are the Young's modulus and Poisson ratio, respectively, of the second material, and $\epsilon$ is the strain due to lattice mismatch between the heteroepitaxial layer and the substrate.

4. The method of claim 1, wherein said step of etching is carried out using a process selected from the group comprising thermal etching, gas etching, surface oxidation and oxide desorption.

5. A method for growing a defect-free heteroepitaxial layer on a substrate comprising the steps of:
   a) providing a substrate formed from a first material;
   b) forming a plurality of separated nucleation sites on a surface of said substrate by the steps of:
      1) forming a plurality of small metal clusters on said substrate;
      2) forming an oxide layer on portions of said substrate surface that are not covered by said metal clusters; and
      3) etching said metal clusters from said substrate, thereby forming exposed portions of said substrate surface that act as said nucleation sites;
   c) growing a layer of a second material on each of said nucleation sites to form a plurality of nucleation islands on said substrate, said second material being selected to be lattice mismatched with said first material; and
   d) continuing the growth of said layer on each of said nucleation sites to increase the size of said islands vertically and laterally until said islands coalesce, thereby forming a thin film heteroepitaxial layer formed from said second material on said substrate.

6. The method of claim 5, wherein said nucleation sites are each no larger than a few hundred nanometers in diameter and are each formed from a single crystal of material.

7. The method of claim 6, wherein said nucleation sites cover less than approximately 50% of said substrate surface.

8. The method of claim 5, wherein said nucleation sites are formed having essentially the same crystal orientation as one another to prevent formation of misfit dislocations between said islands when they coalesce.

9. The method of claim 5, wherein said metal clusters are formed from Al that is evaporated onto said substrate, and said oxide layer is formed from $SiO_2$.

10. A method for growing a defect-free heteroepitaxial layer on a substrate comprising the steps of:
    a) providing a substrate formed from Si;
    b) forming a plurality of separated nucleation sites on a surface of said substrate by the steps of:
       1) forming a plurality of GaAs islands on said substrate surface by growing a thin layer of GaAs on said substrate;
       2) oxidizing said substrate surface and said GaAs islands, there-by forming GaAs native oxide over said GaAs islands, and $SiO_2$ over portions of said substrate surface not covered by said GaAs islands; and
       3) heating said substrate to desorb said GaAs native oxide without desorbing said $SiO_2$, thereby exposing said GaAs islands which act as said nucleation sites;
    c) growing a layer of a second material on each of said nucleation sites to form a plurality of nucleation islands on said substrate, said second material being selected to be lattice mismatched with said first material; and
    d) continuing the growth of said layer on each of said nucleation sites to increase the size of said islands vertically and laterally until said islands coalesce, thereby forming a thin film heteroepitaxial layer formed from said second material on said substrate.

11. The method of claim 10, wherein said nucleation sites are each no larger than a few hundred nanometers in diameter and are each formed from a single crystal of material.

12. The method of claim 11, wherein said nucleation sites cover less than approximately 50% of said substrate surface.

13. The method of claim 10, wherein said nucleation sites are formed having essentially the same crystal orientation as one another to prevent formation of misfit dislocations between said islands when they coalesce.

* * * * *